US005491879A

United States Patent [19]

Bauer

[11] Patent Number: 5,491,879
[45] Date of Patent: Feb. 20, 1996

[54] PROCEDURE TO POLARIZE AT LEAST ONE ZONE OF A FOIL OF FERROELECTRIC MATERIAL TO PRODUCE A POLARIZED ELEMENT FOR PIEZOELECTRIC OR PYROELECTRIC TRANSDUCERS

[75] Inventor: Francois Bauer, Saint-Louis, France

[73] Assignee: Institut Franco-Allemand de Recherches de Saint-Louis, Cedex, France

[21] Appl. No.: 177,543

[22] Filed: Jan. 5, 1994

[30] Foreign Application Priority Data

Jan. 6, 1993 [FR] France .................................. 93 00064

[51] Int. Cl.$^6$ .................................................. H04R 17/00
[52] U.S. Cl. .......................... 29/25.35; 29/631.1; 310/365
[58] Field of Search .............................. 29/25.35, 25.42, 29/631, 631.1, 831, 884; 310/800, 358, 365, 367

[56] References Cited

U.S. PATENT DOCUMENTS

| 4,574,438 | 3/1986 | Diepers et al. | 29/25.35 X |
| 4,612,145 | 9/1986 | Keith et al. | 29/631.1 X |
| 4,651,120 | 3/1987 | Aagard | 29/25.35 X |
| 4,783,888 | 11/1988 | Fujii et al. | 29/25.35 |
| 5,058,250 | 10/1991 | Turnbull | 29/25.35 |

FOREIGN PATENT DOCUMENTS

| 0087991 | 9/1983 | European Pat. Off. . | |
| 0187668 | 7/1986 | European Pat. Off. . | |
| 2305030 | 10/1976 | France . | |
| 0155820 | 9/1982 | Japan | 29/25.35 |
| 0148480 | 9/1983 | Japan | 29/25.35 |

*Primary Examiner*—Peter Vo
*Assistant Examiner*—Khan V. Nguyen
*Attorney, Agent, or Firm*—Young & Thompson

[57] ABSTRACT

A method of polarizing selected areas of a foil of ferroelectric material, wherein electrodes are deposited in such a way on the opposite surfaces of the foil that the zone to be polarized extends between these two electrodes. The zone to be polarized is compressed and a variable voltage is applied across the electrodes. Each electrode is connected to an insulating support whose surface exceeds that of the zone to be polarized on the foil of ferroelectric material. Besides the electrode, the insulating support has a layer of dielectric material whose external surface is level with the external surface of the electrode.

10 Claims, 3 Drawing Sheets

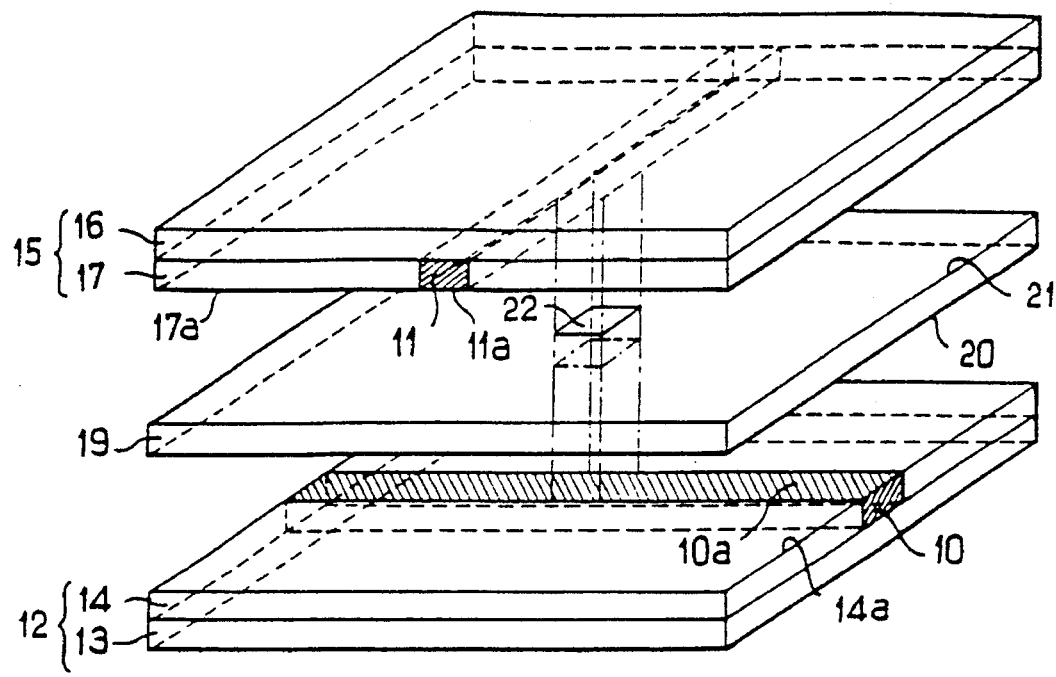
FIG_2
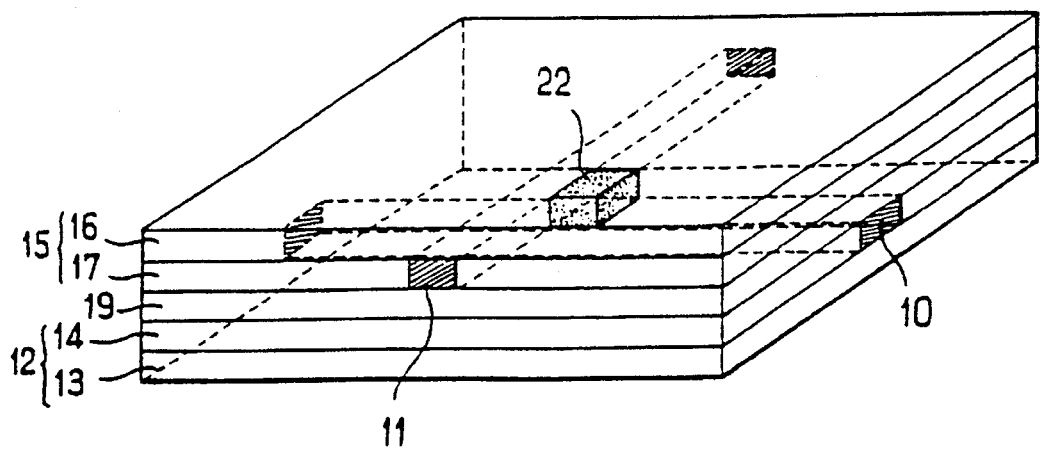
FIG_3

5,491,879

PROCEDURE TO POLARIZE AT LEAST ONE ZONE OF A FOIL OF FERROELECTRIC MATERIAL TO PRODUCE A POLARIZED ELEMENT FOR PIEZOELECTRIC OR PYROELECTRIC TRANSDUCERS

BACKGROUND OF THE INVENTION

1. Field of the Invention

The present invention relates to a procedure to polarize at least one zone of a foil of ferroelectric material. In addition, the invention relates to a procedure to produce a piezoelectric or pyroelectric transducer by means of this polarization procedure.

2. Description of the Prior Art

In his preceding French patent application FR-A-2 538 157, the applicant described a procedure and a device to polarize ferroelectric materials. According to this procedure a low-frequency alternating electric field is applied to the ferroelectric material, and then the amplitude of this alternating electric field is progressively increased so that there is a controlled remaining polarization left in the material. The maximum amplitude of the electric field is relatively high because it must exceed the coercive field of the ferroelectric material.

Today this procedure is widely applied, especially to produce piezoelectric or pyroelectric transducers. In general the procedure starts with the deposition of the measurement electrodes of the transducer on the two opposite surfaces of a foil of ferroelectric material, for example by sputtering or evaporation. These electrodes are used to apply the alternating electric field during the polarization phase. The foil of ferroelectric material is generally compressed to limit volume variations which may locally occur due to the higher values of the electric field during the polarization phase, because these variations tend to adversely affect the reproducibility of the transducer's characteristics. In practice, the pressure which can thus be exerted on the foil of ferroelectric material is limited, typically to some hundred bars, otherwise there would be a deterioration of the ferroelectric material near the edges of the deposited electrodes or a deterioration of the electrodes themselves if they cover a relatively large area.

In addition, the respective parts of the measurement electrodes which extend from the polarized zone in order to provide connections must be relatively far apart from each other and parallel to the foil of ferroelectric material. This spacing is necessary because of the high voltages involved: in case of a small spacing there is the risk of breakdown, flashover or polarization of the material. As a result the dimensions of the pickup transducer increase.

It is difficult to use the procedure described above to polarize a zone with reduced dimensions on a foil of ferroelectric material, typically a zone with dimensions below 1 mm$^2$ on a foil having a thickness of approximately 25 μm. Because of these small dimensions the edge effects become significant and even preponderant and complicate the interpretation of the current measurements. These edge effects also affect the homogeneity of the induced remaining polarization. The polarization is equal to the ratio of the quantity of charges and the geometrical surface. In addition, the local stress within the ferroelectric material resulting from these small dimensions becomes important so that a higher pressure is required to limit its effect, and this results in problems of mechanical strength which have been mentioned before.

These inconveniences can also be found in connection with large surfaces, even if their impact on the measurements is less important.

SUMMARY AND OBJECT OF THE INVENTION

It is a main objective of the present invention to overcome these difficulties of the known polarization procedures by proposing a polarization procedure which is compatible with the application of a relatively high pressure and preferentially suitable to polarize zones with small dimensions on a foil of ferroelectric material.

The invention proposes therefore a procedure to polarize a zone on a foil of ferroelectric material. During this procedure electrodes are installed in such a way on the two opposite surfaces of the foil that the zone to be polarized extends between these two electrodes. Then the zone to be polarized is compressed, and a variable voltage is applied across the electrodes. The procedure is characterized by the fact that each electrode is connected to an insulator whose surface is larger than that of the zone to be polarized on the foil of ferroelectric material. On either side of the electrode this insulator consists of a layer of dielectric material which is at least twice as thick as the foil to be polarized and whose external surface is level with the external surface of the electrode which presents a suitable surface finish.

Therefore the electrodes used in the polarization phase are not connected to the foil to be polarized, but to separate supports. Each support has a smooth surface which is directed towards the foil to be polarized, a part of this surface belonging to the actual electrode.

Thus if a high pressure is used to compress the zone to be polarized so that a high electric field can be applied, this pressure generates a stress which can be high, but is uniformly distributed in the ferroelectric material and the electrode supports. Consequently the ferroelectric material and the electrodes will not be damaged by this stress.

According to a preferential version of the invention the electric permittivity of the dielectric material is at least on the order of that of the ferroelectric material. Thus it is possible to minimize the undesirable influence of the edge effects on the current measurements which are used to control the polarization process. The dielectric material and the ferroelectric material are preferentially made from one element, the dielectric material being constituted by a non-polar phase of this element. Examples of dielectric materials are PVC (polyvinyl chloride) with an $\epsilon_r$ of 9 (max.) and the linear polyurethanes with $7.5 < \epsilon_r < 9$.

As the electrodes have an oblong form they are advantageously installed on the opposite sides of the foil in such a way that they are approximately perpendicular to each other.

The second aspect of the invention relates to a procedure for producing a polarized element for piezoelectric or pyroelectric transducers comprising a foil of ferroelectric material with at least one polarized zone. This procedure is characterized by the fact that the zone on the foil of ferroelectric material is polarized by a procedure as defined above and that measurement electrodes are then deposited on the two opposite sides of the foil with these measurement electrodes covering the polarized zone.

Using this procedure it is possible to produce transducers which offer the advantage of small dimensions and whose sensitivity characteristics can be controlled in a precise and reliable way. Thus it is possible to manufacture impact pressure transducers with minimum inductive coupling.

BRIEF DESCRIPTION OF THE DRAWINGS

Other characteristics and advantages of the present invention will become evident in the course of the following description which illustrates a preferred embodiment without claiming completeness. This description refers to the following enclosed figures:

FIG. 2 shows an exploded and perspective view of a foil of material to be polarized and two electrode supports.

FIG. 3 shows a view similar to that of FIG. 2 illustrating the electrode supports which are applied to the foil to be polarized.

DESCRIPTION OF THE PREFERRED EMBODIMENT

Figure 1:
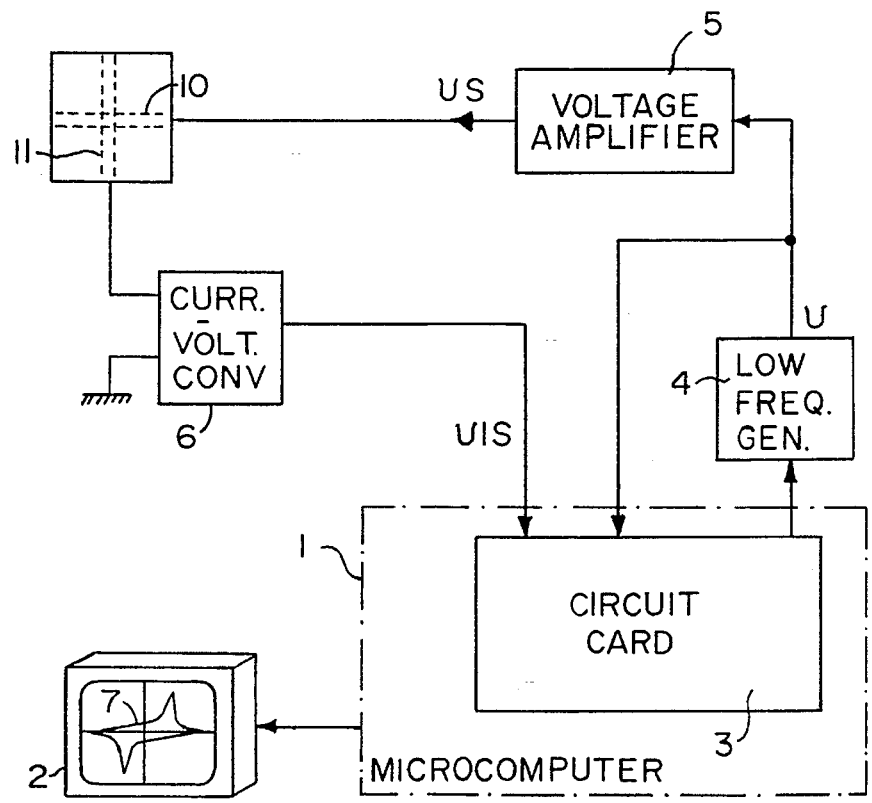
FIG. 1 is a diagram showing a setup which can be used to execute the polarization procedure according to the invention.

FIG. 1 shows a facility for the polarization of ferroelectric materials, especially crystals, polycrystals, polymers or copolymers as for example polyvinylidene fluorides (PVDF). This facility comprises analog and digital circuits, but it is also possible to use an entirely analog system for the present invention, as for example that described in the patent application FR-A-2 538 157. The operating principle of the facility illustrated in FIG. 1 is based on that of the facility described in the above-mentioned document.

The facility of FIG. 1 comprises a computer, as for example a microcomputer (1) with a visual display unit (2). The microcomputer is equipped with a circuit card (3) to control the procedure. The circuit card (3) controls a low-frequency generator (4) which generates a low-frequency sinusoidal voltage U with variable amplitude. This voltage U is coupled to the input of a voltage amplifier (5) which applies the amplified voltage US to one of the polarization electrodes (10). The other polarization electrode (11) is grounded to zero potential. A current-voltage converter (6) is preferentially connected between the electrode (11) and ground to measure the current flow IS in the ferroelectric material which is due to the application of the variable voltage US. Of course the current could also be measured at the first electrode, but as this electrode is referenced to a higher potential this measurement would cause technical problems. The measurement can be performed as is good practice, but the method shall not affect the current to be measured. The result of the measurement is transmitted to the circuit card (3) as a voltage signal UIS which is proportional to the current IS. In addition, the circuit card (3) receives the voltage signal U which is proportional to the applied voltage US. The circuit card (3) contains analog-to-digital converters (not shown here) which convert the voltage signals U and UIS to digital signals representing the voltage US and the current IS in the ferroelectric material. These digital signals are then processed by the circuit card (3) so that the corresponding curves (7) representing the signals U and UIS can be displayed on the screen (2) of the microcomputer.

The arrangement of the electrodes (10, 11) is illustrated in FIGS. 2 and 3. Each electrode (10, 11) is connected to an electrically insulated support (12 and 15, respectively). Each support (12, 15) comprises a rigid insulation plate (13, 16), on which the oblong electrode (10, 11) is deposited, and a layer of dielectric material (14, 17) whose external surface (14a, 17a) is level with the external surface (10a, 11a) of the electrodes (10, 11). The layers of dielectric material (14, 17) are at least twice as thick as the foil (19) to be polarized.

Advantageously the electrodes (10, 11) and their supports (12, 15) can be produced as follows:

The electrodes (10, 11) are deposited on the rigid plates (13, 16), for example by using thick-film technology, for printed circuits.

The external surfaces (10a, 11a) of the electrodes on the printed circuit are polished.

The layers of dielectric material (14, 17) are deposited on the circuit card by means of spin coating.

The external surfaces (14a, 17a) of the layers of dielectric material (14, 17) are polished.

PVDF in phase α (non-polar phase, relative permittivity on the order of 12) or any other material which has been mentioned before, as for example PVC, linear polyurethanes etc., can be used as material for the dielectric layers (14, 17). This material is applied by means of molding to obtain thick layers and by means of spin coating to obtain thin layers. As is well-known the latter method comprises the following steps: A 15% solution of PVDF in dimethylformamide is prepared; a sufficient quantity of this liquid mixture is deposited on the printed circuit to cover it completely; the printed circuit is then placed in a centrifuge where it is exposed to a rotational speed of 4000 rpm for several seconds and then for one second to a rotational speed of 5000 to 6000 rpm so that the excess solution at the edge is removed. The resultant layer has a thickness in the range of 2 to 4 µm. The complete component is dried for 24 hours at a temperature of 150° C.

As a variant, the electrode supports can be produced by preparing a support with a uniform layer of dielectric material, as for example PVDF, and by implanting the conducting particles into a portion of this layer to form the electrode.

An electrode can also be implanted into the PVDF by compressing it in the PVDF by means of a conventional molding method in the course of which the temperature is set to a value (e. g.190° C. ) above the melting temperature of the material (175° C.).

To polarize the ferroelectric material, the electrodes (10, 11) are installed in such a way on the opposite sides (20, 21) of the foil of ferroelectric material (19) that they are approximately perpendicular to each other, as is shown in FIGS. 2 and 3. Other configurations are also possible: The electrodes can be circular or annular, for example, and they can be placed opposite each other. The zone to be polarized (22) extends between the two electrodes (10, 11). Each insulating support (12, 15) has a surface area exceeding that of the zone to be polarized (22) on the foil of ferroelectric material (19) so that the zone to be polarized (22) and part of the foil (19) surrounding this zone can be compressed homogeneously while pressure is exerted on the supports (12, 15). Thus the applied pressure can have an advantageously high value, typically in the range between 50 and 200 MPa depending on the materials involved.

When the foil (19) is compressed, the circuit card (3) applies a control signal to the generator (4) so that the latter generates a voltage U with a very low frequency (some hundredths Hertz). The amplitude of this voltage is slowly increased by the amplifier (5) until it reaches a suitable value to apply an electric field across the electrodes (10, 11) whose field strength exceeds that of the coercive field $E_c$ of the ferroelectric material to be polarized. During this phase the signals U and UIS representing the voltage US and the current IS in the zone to be polarized (22) are processed to extract the resistive component IR and the capacitive component IC of the current IS. The resistive component IR is calculated according to the formula IR=US/R where R designates the known internal resistance of the ferroelectric material. The capacitive component IC is calculated according to the formula IC=ε (dUS/dt) where ε designates the known permittivity of the ferroelectric material and the ratio (dUS/dt) designates the time derivative of the amplified voltage US. After subtraction of the components IR and IC the polarization component IP is left: IP=IS−IR−IC=(dP/dt). This component is equal to the time derivative of the polarization P in the ferroelectric material.

Figure 4:
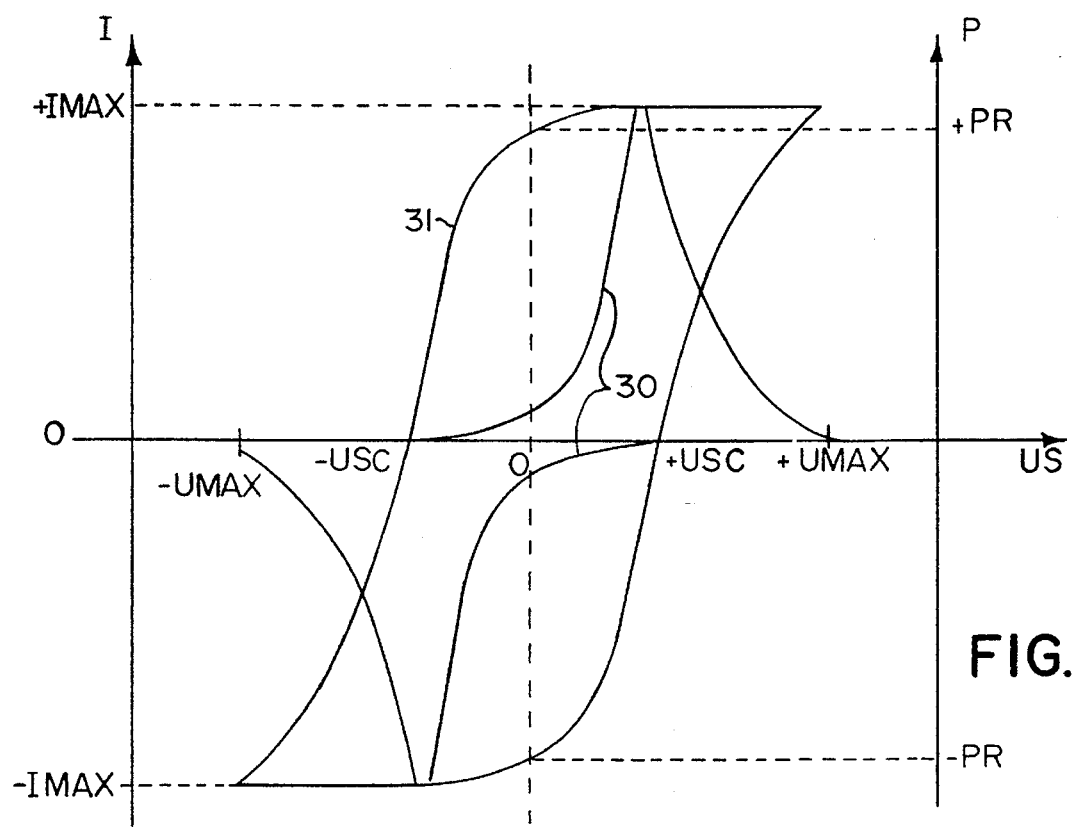
FIG. 4 is a diagram illustrating the hysteresis loops of current rating and polarization which are recorded at the end of the polarization procedure.

In the course of this process, the variations of the polarization component IP which depend on the applied voltage US are displayed as a hysteresis loop (30, see FIG. 4) on the screen (2) of the microcomputer (1). This loop has two symmetric peaks with respect to the origin. The value of the polarization P is calculated by integrating the current IP, and its voltage-dependent variations are also displayed on the screen (2) as a hysteresis loop (31). By observing the loops (30, 31) being displayed it can be ensured that they have stabilized at the end of the process. If the voltage US is removed, a remanent polarization PR is left in zone (22) of foil (19) which is indicated in FIG. 4. Experience has shown that the maximum IP values are identical for all polarized elements of a given material having the same voltage level: this means that the procedure according to the invention guarantees the reproducibility of the desired effect.

The procedure described above can be used to produce piezoelectric or pyroelectric transducers. After having separated the electrode supports (12, 15) from the foil (19), the measurement electrodes are deposited on the two opposite sides (20, 21) of the foil so that these electrodes cover the polarized zone (22). The measurement electrodes can be arranged in a compact configuration, for example one on top of the other, to obtain a sensor of small dimensions, but in the previous procedures in which the measurement electrodes are also used during the polarization process the electrodes had to be relatively far apart.

Figure 5:
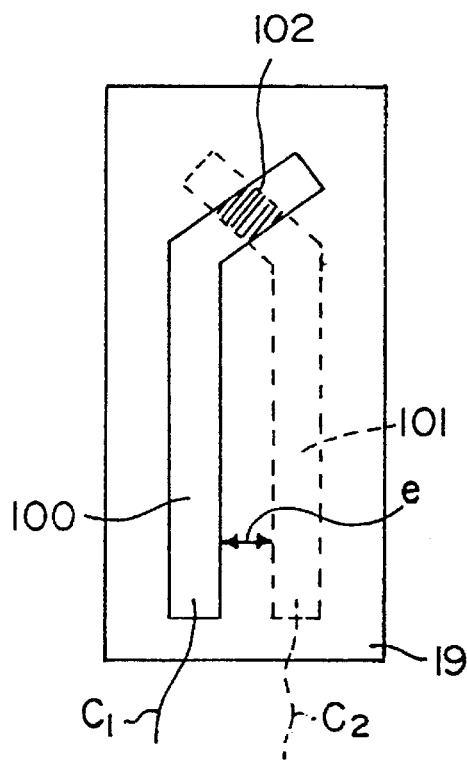
FIG. 5 shows a drawing of the configuration of a shock sensor manufactured according to known techniques.
Figure 6:
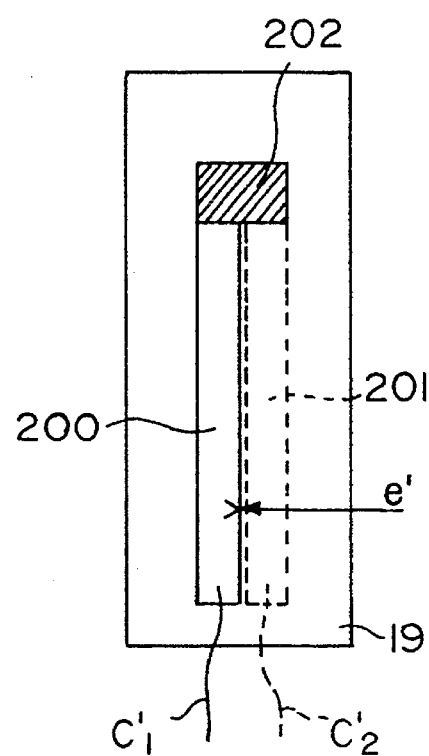
FIG. 6 shows a drawing of the configuration of a shock sensor according to the invention.

FIGS. 5 and 6 schematically illustrate two configuration examples for transducers, one example (FIG. 5) showing a transducer according to known technology and the other example (FIG. 6) showing a transducer in conformity with the findings of this invention.

Each of the two transducers has a base material (19) which is made of the ferroelectric materials mentioned above.

The conventional transducer of FIG. 5 is equipped with a set of electrodes installed on either side of the base material (19). These electrodes form an overlapping zone or active zone (102, hatched area in FIG. 5) and elongated zones (100, 101) which are used to establish contacts ($C_1$ and $C_2$). The electrodes have been used to polarize the base material (19), and thus the distance e between their projections onto a plane parallel to the base material (19) should be sufficient to avoid the parasitic effects described above.

The transducer according to the procedure of the invention which is illustrated in FIG. 6 also has an overlapping zone or active zone (202, hatched area in FIG. 6), but the distance e' between the elongated zones (200, 201) which establish the contacts $C'_1$ and $C'_2$ can be reduced to a minimum: in fact the distance e' can be equal to zero, because the measurement electrodes are installed after the polarization of the material in the overlapping zone (202) in accordance with one of the important characteristics of the invention.

Without claiming completeness this type of transducer can be used as an impact sensor, for example. By means of a transducer configuration as allustrated in FIG. 6 it is possible to attain a minimum inductive coupling. Measurements have shown that the inductance of a transducer configuration as in FIG. 6 is by 50 to 80 times lower than that of an equivalent, but conventional transducer (FIG. 5).

Hence an impact sensor thus designed is obviously more efficient than a conventional transducer.

The zone to be polarized (22) may have large dimensions, but reduced dimensions, for example below 1 mm, are above all more favourable. Then the electric permittivity of the dielectric material of layers (14) and (17) should preferably be on the order of the permittivity of the ferroelectric material of the foil (19) so that the edge effects on the current measurements are reduced. Therefore it is especially appropriate to choose the same element, for example PVDF, as material for the layers (14, 17) and the foil (19). PVDF in the layers is in the nonpolar phase α, and in the foil it is in the polar phase β (ferroelectric).

The procedure according to the invention has been tested by the applicant, especially using the following embodiment: a foil of PVDF in phase β being 26 μm thick and having a polarized zone of: 0.53 mm×0.57 mm (surface area=0.003 cm$^2$). With the coercive field in this material corresponding to a voltage USC of approximately 2.2 kV, the test started by applying a sinusoidal voltage US at a frequency of 0.04 Hz across the electrodes (10, 11) and by increasing the amplitude from 0 to 3 kV over a period of 55 minutes. Then a sinusoidal voltage US at a frequency of 0.02 Hz was applied whose amplitude was increased from 3 to 5 kV over a period of 95 minutes. At the end of this polarization phase, hysteresis loops (30, 31) similar to those in FIG. 4 were observed while the maximum amplitude UMAX of voltage US had a value of 5 kV and the maximum polarization current IMAX a value of approximately 0.0138 μA. The selected remanent polarization had a value of approximately 6.7 μC/cm$^2$ and the piezoelectric coefficient $d_{33}$ a value of approximately 15 pC/N.

In addition and surprisingly enough, this device permitted large surfaces of ferroelectric polymers to be polarized while breakdowns due to the edge effects were unexpectedly reduced.

Although the invention has been described with reference to specific embodiments, it is obvious that it is not limited to these examples and that various modifications can be made without leaving the scope of this invention. In particular it is well possible to use copolymers instead of polymers as basic material for the support to be polarized; $VF_2/VF_3$ is a typical example, without being limited to this.

I claim:

1. Process of polarizing at least one zone (22) on a foil of ferroelectric material (19), comprising the steps of:

connecting each of two polarization electrodes (10, 11) to a corresponding insulating support (12, 15) whose surface area exceeds that of the zone to be polarized (22) on the foil (19), said support (12, 15) comprising a layer of dielectric material (14, 17) whose external surface (14a, 17a) is made level with the external surface (10a, 11a) of the polarization electrode (10, 11), on either side of the polarization electrode (10, 11), wherein the layer of dielectric material (14, 17) is at least twice as thick as the foil (19) of the material to be polarized;

positioning said polarization electrodes (10, 11) connected to said insulating support (12, 15) on two opposite surfaces (20, 21) of said foil (19) with the zone to be polarized (22) extending between said polarization electrodes (10, 11);

compressing the zone to be polarized (22) by applying a pressure on said insulating supports (12, 15); and applying a variable voltage across the polarization electrodes (10, 11) to form said at least one polarized zone on said foil.

2. Process as claimed in claim 1, wherein the electric permittivity of said dielectric material is at least substantially equal to the electric permittivity of said ferroelectric material.

3. Process as claimed in claim 2, wherein said dielectric material and said ferroelectric electric material are produced using a same elements, the dielectric material being constituted by a nonpolar phase of said element.

4. Process as claimed in claim 1, wherein each insulating support (12, 15) comprises a rigid plate (13, 16) forming a printed circuit with an electrode (10, 11) being deposited on this plate (13, 16).

5. Process as claimed in claim 1, wherein an electrode is formed on a support with a uniform layer of dielectric material by implanting conducting particles in a portion of the said layer of dielectric material.

6. Process as claimed in claim 1, wherein the insulating supports (12, 15) of the electrodes (10, 11) compress the foil of ferroelectric material in a pressure range between 50 MPa and 200 MPa.

7. Process as claimed in claim 1, wherein the electrodes (10, 11) have an oblong form and the electrodes (10, 11) are positioned on the opposite surfaces (20, 21) of the foil (19) in such a way that said electrodes (10, 11) are approximately perpendicular to each other.

8. Process as claimed in claim 1, wherein the ferroelectric material (19) is a polymer.

9. Process as claimed in claim 1, wherein the ferroelectric material (19) is a copolymer.

10. Process as claimed in claim 1 further comprising:

separating said polarization electrodes (10, 11) and insulating supports (12, 15) from the foil (19); and depositing measurement electrodes (200, 201) on the two opposite surfaces of the foil (19), with these measurement electrodes (200, 201) covering said at least one polarized zone (22, 202);

whereby a polarized element for piezoelectric or pyroelectric transducers is produced from said at least one polarized zone (22, 202) of said foil (19).

* * * * *